(12) United States Patent
Li et al.

(10) Patent No.: US 12,289,863 B2
(45) Date of Patent: Apr. 29, 2025

(54) MANIFOLD ASSEMBLY AND MANIFOLD

(71) Applicants: INVENTEC (PUDONG) TECHNOLOGY CORPORATION, Shanghai (CN); INVENTEC CORPORATION, Taipei (TW)

(72) Inventors: Biao Li, Shanghai (CN); Lei Zhou, Shanghai (CN); Lian-Fei Zhang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 216 days.

(21) Appl. No.: 18/209,817

(22) Filed: Jun. 14, 2023

(65) Prior Publication Data

US 2024/0407130 A1    Dec. 5, 2024

(30) Foreign Application Priority Data

Jun. 2, 2023    (CN) .......................... 202310651873.8

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
CPC .................. H05K 7/20272; H05K 7/20781
USPC ....................................................... 165/80.4
See application file for complete search history.

(56) References Cited

U.S. PATENT DOCUMENTS

| | | | | |
|---|---|---|---|---|
| 3,481,393 A | * | 12/1969 | Chu .................. | H01L 25/03 165/104.31 |
| 4,690,209 A | * | 9/1987 | Martin ............... | F25B 47/006 165/149 |
| 4,791,983 A | * | 12/1988 | Nicol ................ | H01L 23/473 257/E23.098 |
| 5,144,531 A | * | 9/1992 | Go .................... | H01L 23/473 257/E23.098 |
| 6,828,675 B2 | * | 12/2004 | Memory ............ | F28D 7/0025 257/714 |
| 7,417,858 B2 | * | 8/2008 | Ouyang ............. | H01L 23/473 361/689 |
| 7,515,418 B2 | * | 4/2009 | Straznicky ........ | H01L 23/4338 361/699 |
| 7,614,445 B2 | * | 11/2009 | Ouyang ............. | F28F 13/16 165/104.33 |

(Continued)

*Primary Examiner* — Claire E Rojohn, III
(74) *Attorney, Agent, or Firm* — Maschoff Brennan

(57) ABSTRACT

A manifold assembly includes a liquid inlet pipe, a plurality of transparent windows and a liquid return pipe. The liquid inlet pipe has a first accommodating space, a first liquid inlet, a plurality of first liquid outlets and a plurality of openings. The first accommodating space is configured to accommodate a cooling liquid, and is in fluid communication with the first liquid inlet, the first liquid outlets and the openings. The transparent windows cover the openings. The cooling liquid is visible from outside via the transparent windows. The liquid return pipe has a second accommodating space, a plurality of second liquid inlets and a second liquid outlet. The second accommodating space is configured to accommodate a cooling liquid, and is in fluid communication with the second liquid inlets and the second liquid outlet.

10 Claims, 3 Drawing Sheets

(56) References Cited

U.S. PATENT DOCUMENTS

| | | | | |
|---|---|---|---|---|
| 7,628,198 | B2* | 12/2009 | Ouyang | G06F 1/20 |
| | | | | 165/80.4 |
| 7,639,498 | B2* | 12/2009 | Campbell | H05K 7/20772 |
| | | | | 165/80.4 |
| 10,334,756 | B1* | 6/2019 | Dede | H01L 23/473 |
| 11,889,663 | B1* | 1/2024 | Liu | H05K 7/20236 |
| 2016/0205810 | A1* | 7/2016 | Marshall | H05K 7/20781 |
| | | | | 165/11.2 |
| 2019/0343026 | A1* | 11/2019 | Zhao | H05K 7/20781 |
| 2021/0136957 | A1* | 5/2021 | Zhu | F28D 15/0275 |
| 2024/0049434 | A1* | 2/2024 | Mohajer | H05K 7/20254 |
| 2024/0407130 | A1* | 12/2024 | Li | H05K 7/20763 |

* cited by examiner

MANIFOLD ASSEMBLY AND MANIFOLD

CROSS-REFERENCE TO RELATED APPLICATIONS

This non-provisional application claims priority under 35 U.S.C. § 119 (a) on Patent Application No(s). 202310651873.8 filed in China, on Jun. 2, 2023, the entire contents of which are hereby incorporated by reference.

BACKGROUND OF THE INVENTION

Technical Field of the Invention

The invention relates to a manifold assembly, more particularly to a manifold assembly which for user visibility of a liquid level of a cooling liquid.

Description of the Related Art

With the arrival of the big data era and the continuous development of cloud technology, the requirements for high performance servers are higher, and amount of the data processed by the servers is increasing. Accordingly, the density of heat transferring at the servers rapidly increases, and heat generated thereby also increases massively. Therefore, the problem of heat dissipation needs to be solved urgently.

The high performance servers may be cooled by a liquid cooling system so as to maintain the performance and prolong the lifespan. Generally, manifolds may be used to distribute cooling liquid to heat source so as to cool the servers efficiently. However, it is difficult to check the current operating status of the liquid cooling system via conventional manifolds. When the cooling liquid cannot flow normally due to failure of some components of the manifolds or the cooling liquid is insufficient due to the loss, it cannot be checked and addressed immediately, which may fail to cool the server and cause the server to be damaged. Therefore, how to enable users to check the current operating status of the liquid cooling system is an important issue to be solved.

SUMMARY OF THE INVENTION

The invention provides a manifold assembly and a manifold capable of allowing users to check the current operating status of the liquid cooling system.

One embodiment of the invention provides a manifold assembly including a liquid inlet pipe, a plurality of transparent windows and a liquid return pipe. The liquid inlet pipe has a first accommodating space, a first liquid inlet, a plurality of first liquid outlets and a plurality of openings. The first accommodating space is configured to accommodate a cooling liquid. The first accommodating space is in fluid communication with the first liquid inlet, the plurality of first liquid outlets and the plurality of openings. The plurality of first liquid outlets are configured to be in fluid communication with at least one server. The plurality of transparent windows cover the plurality of openings. The cooling liquid is visible from outside via the plurality of transparent windows. The liquid return pipe has a second accommodating space, a plurality of second liquid inlets and a second liquid outlet. The second accommodating space is configured to accommodate a cooling liquid. The second accommodating space is in fluid communication with the plurality of second liquid inlets and the second liquid outlet. The plurality of second liquid inlets are configured to be in fluid communication with the at least one server.

Another embodiment of the invention provides a manifold including a pipe and a plurality of transparent windows. The pipe has an accommodating space, a liquid inlet, a plurality of liquid outlets and a plurality of openings. The accommodating space is configured to accommodate a cooling liquid. The accommodating space is in fluid communication with the liquid inlet, the plurality of liquid outlets and the plurality of openings. The plurality of liquid outlets are configured to be in fluid communication with at least one server. The plurality of transparent windows cover the plurality of openings. The cooling liquid is visible from outside via the plurality of transparent windows.

According to the manifold assembly and the manifold disclosed by the above embodiments, since the liquid inlet pipe has the plurality of openings which are covered by the plurality of transparent windows, the cooling liquid in the liquid inlet pipe is visible from outside via the plurality of transparent windows. Therefore, the liquid level of the cooling liquid can be checked. Accordingly, when the liquid level of the cooling liquid is abnormal, it can be checked and addressed promptly.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

Figure 1:
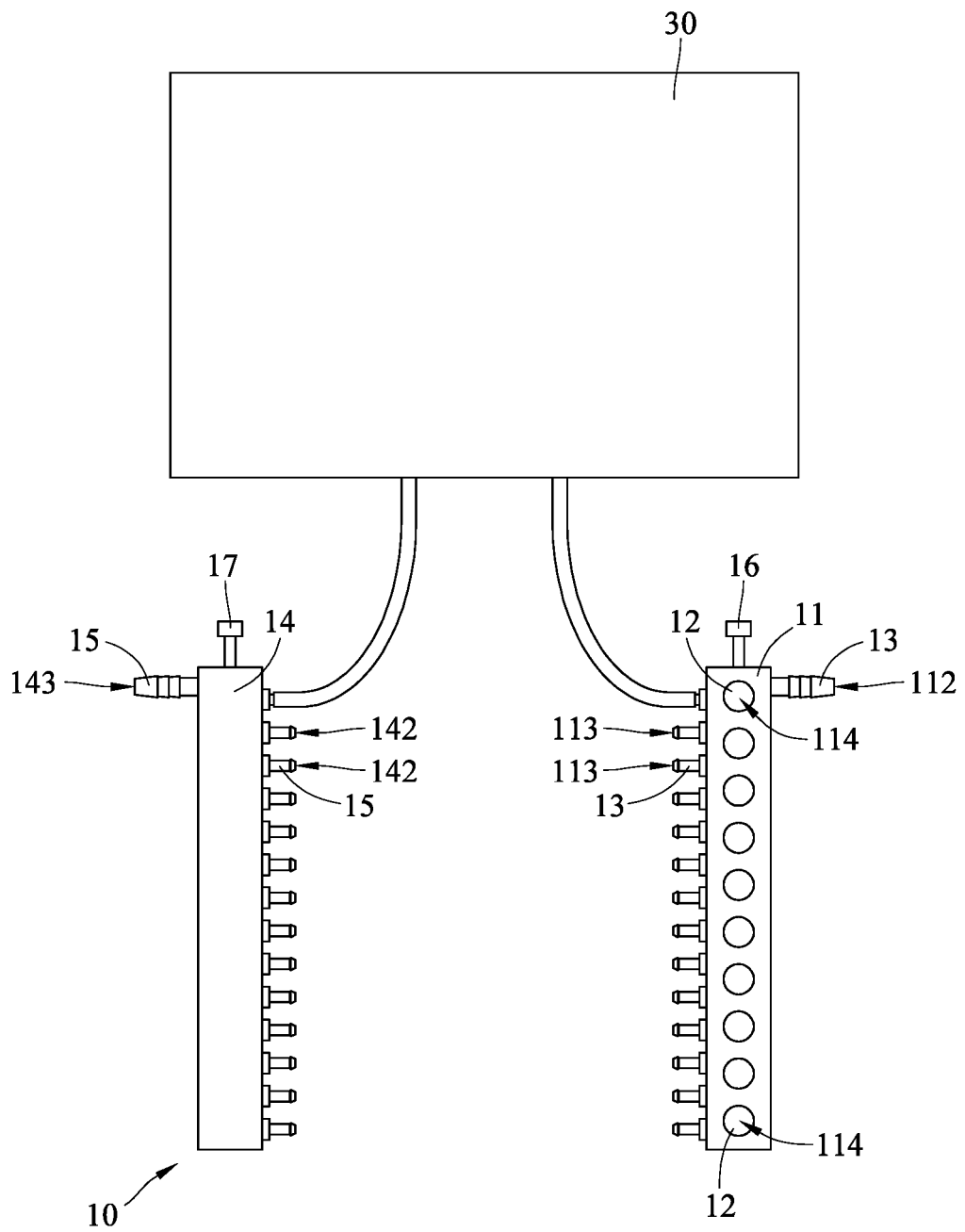
FIG. 1 is a plane view of a manifold assembly and a server in accordance with one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
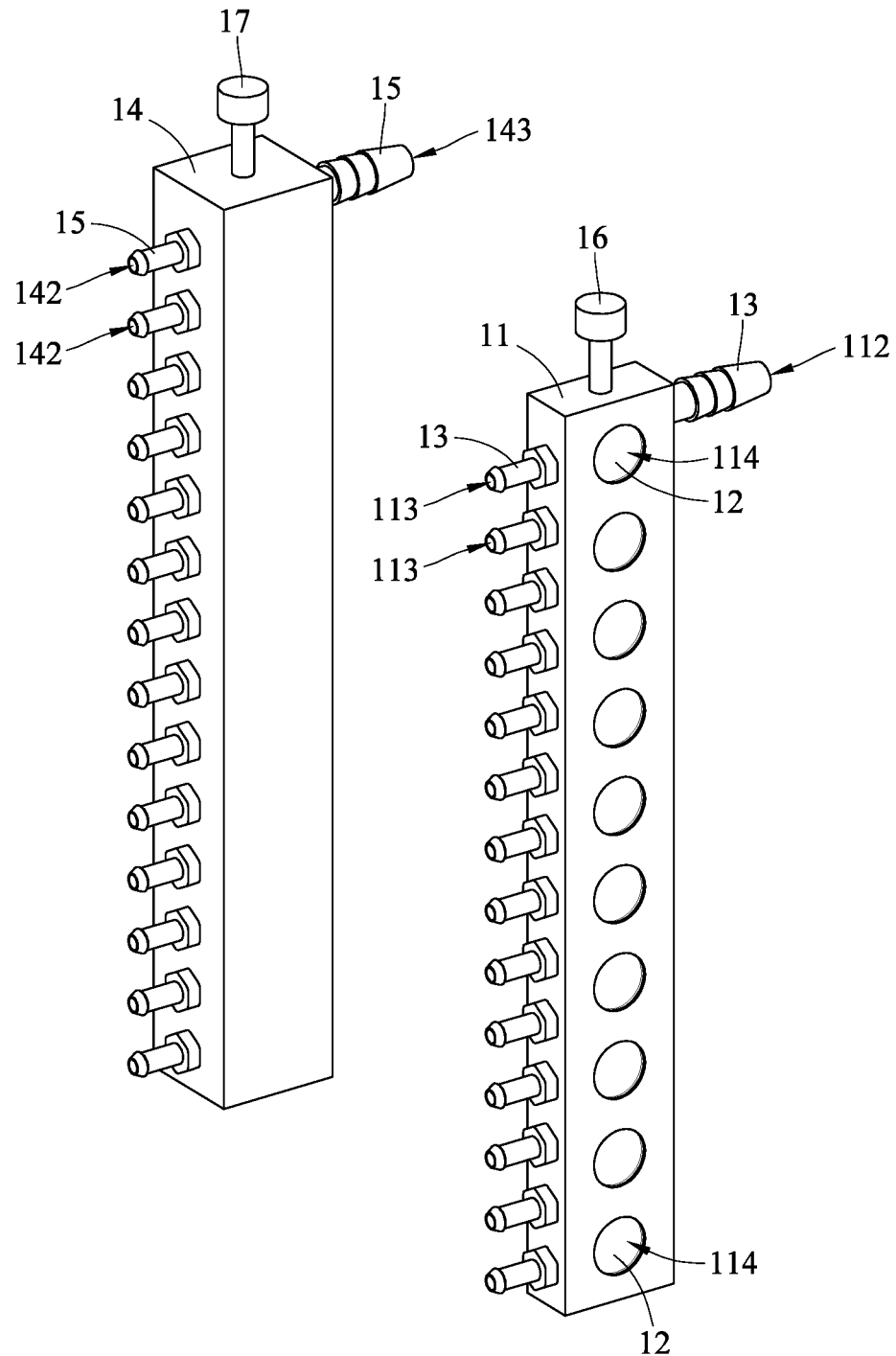
FIG. 2 is a perspective view of the manifold assembly in FIG. 1.
Figure 3:
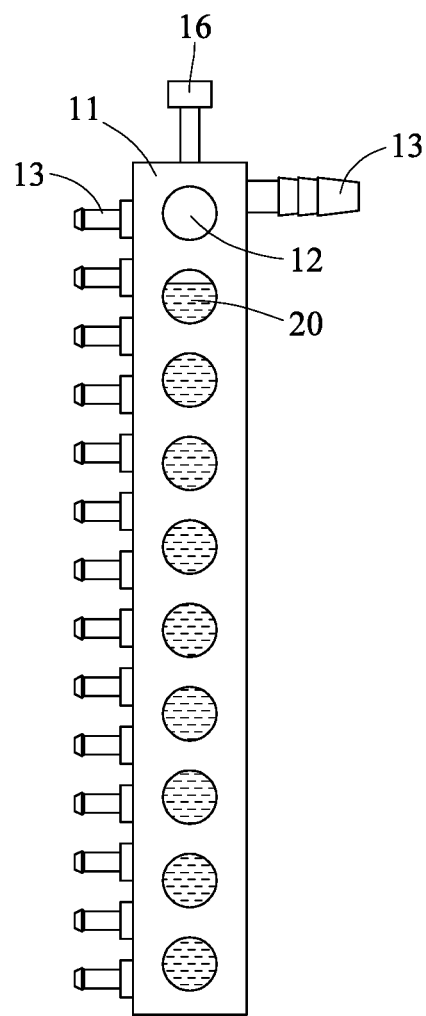
FIG. 3 is a plane view of a liquid inlet pipe of the manifold assembly in FIG. 1.

Please refer to FIG. 1 to FIG. 3, where FIG. 1 is a plane view of a manifold assembly 10 and a server 30 in accordance with one embodiment of the invention, FIG. 2 is a perspective view of the manifold assembly 10 in FIG. 1, and FIG. 3 is a plane view of a liquid inlet pipe 11 of the manifold assembly 10 in FIG. 1.

Figure 4:
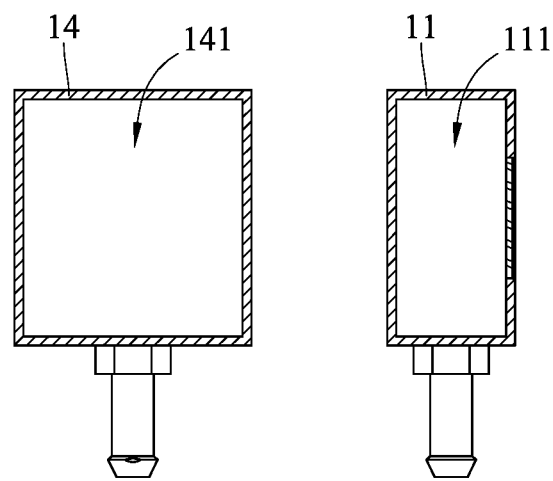
FIG. 4 is a cross-sectional view of the manifold assembly in FIG. 1.

In this embodiment, the manifold assembly 10 includes a liquid inlet pipe 11, a plurality of transparent windows 12, a plurality of first pipe connectors 13, a liquid return pipe 14 and a plurality of second pipe connectors 15. The liquid inlet pipe 11 has a first accommodating space 111, a first liquid inlet 112, a plurality of first liquid outlets 113 and a plurality of openings 114. Please refer to FIG. 1 to FIG. 4, where FIG. 4 is a cross-sectional view of the manifold assembly 10 in FIG. 1. The first accommodating space 111 is configured to accommodate a cooling liquid 20, and is in fluid communication with the first liquid inlet 112, the plurality of first liquid outlets 113 and the plurality of openings 114. The cooling liquid 20 is, for example, deionized water, glycol solution or propylene glycol solution. The plurality of first liquid outlets 113 are configured to be in fluid communication with one or more server(s) 30. The plurality of transparent windows 12 are, for example, acrylic plates or tempered glasses, and cover the plurality of openings 114, so that the cooling liquid 20 is visible from outside via the plurality of transparent windows 12. Accordingly, the current liquid level of the cooling liquid 20 can be checked. The plurality of first pipe connectors 13 are, for example, leak-proof pipe connectors, and are located at the first liquid inlet 112 and the plurality of first liquid outlets 113 of the liquid inlet pipe 11, respectively, so that the cooling liquid 20 is prevented from leaking out of the plurality of first pipe connectors 13.

The liquid return pipe 14 has a second accommodating space 141, a plurality of second liquid inlets 142 and a second liquid outlet 143. The second accommodating space 141 is configured to accommodate a cooling liquid 20, and is in fluid communication with the plurality of second liquid inlets 142 and the second liquid outlet 143. The plurality of second liquid inlets 142 are configured to be in fluid communication with one or more server(s) 30. The plurality of second pipe connectors 15 are, for example, leak-proof pipe connectors, and are located at the plurality of second liquid inlets 142 and the second liquid outlet 143 of the liquid return pipe 14, respectively, so that the cooling liquid 20 is prevented from leaking out of the plurality of second pipe connectors 15.

In this embodiment, the first liquid inlet 112 of the liquid inlet pipe 11 and the second liquid outlet 143 of the liquid return pipe 14 are, for example, in fluid communication with a cooling distribution unit (CDU, not shown) to distribute the cooling liquid 20 to one or more server(s) 30. Accordingly, the cooling liquid 20 can flow in a circulating channel formed by the liquid inlet pipe 11, the server(s) 30, the liquid return pipe 14 and the CDU so as to continuously cool the server(s) 30.

In this embodiment, chemical substances with different colors such as copper sulfate can be added to the cooling liquid 20, so that the cooling liquid 20 can be colored for visibility purposes. Accordingly, the current liquid level of the cooling liquid 20 can be checked more clearly.

In this embodiment, the manifold assembly 10 further includes a first exhaustion valve 16 and a second exhaustion valve 17. The first exhaustion valve 16 is arranged adjacent to the first liquid inlet 112, the plurality of first liquid outlets 113 and the plurality of openings 114 of the liquid inlet pipe 11. The second exhaustion valve 17 is arranged adjacent to the plurality of second liquid inlets 142 and the second liquid outlet 143 of the liquid return pipe 14. The excess air in the liquid inlet pipe 11 and the liquid return pipe 14 can be discharged to reduce the pressure in the liquid inlet pipe 11 and the liquid return pipe 14 via the exhaustion valves 16 and 17, so that the cooling liquid 20 can flow to the upper end of the liquid inlet pipe 11. Accordingly, the server 30 connected to the upper end of the liquid inlet pipe 11 and the upper end of the liquid return pipe 14 can be cooled.

In this embodiment, the lowered liquid level of the cooling liquid 20, for example, either due to the failure of the exhaustion valves 16 and 17 or due to the loss of the cooling liquid 20 during the circulating flow can be checked via the plurality of transparent windows 12, and then the manifold assembly 10 can be repaired immediately or the cooling liquid 20 can be added immediately.

In this embodiment, a cross-sectional area of the liquid return pipe 14 is, for example, 1.5 times to 2 times larger than a cross-sectional area of the liquid inlet pipe 11. Accordingly, the cooling liquid 20 can flow in the liquid inlet pipe 11 and the liquid return pipe 14 more evenly.

In this embodiment, the liquid inlet pipe 11 has a plurality of openings 114, the manifold assembly 10 includes a plurality of transparent windows 12, and the plurality of transparent windows 12 cover the plurality of openings 114, so that the cooling liquid 20 is visible from outside via the plurality of transparent windows 12, but the present invention is not limited thereto. In other embodiments, the liquid inlet pipe may have one opening merely, the manifold assembly may include one transparent window merely, and the transparent window covers the opening, so that the cooling liquid is visible from outside via the transparent window.

According to the manifold assembly and the manifold disclosed by above embodiments, since the liquid inlet pipe has the plurality of openings which are covered by the plurality of transparent windows, the cooling liquid in the liquid inlet pipe is visible from outside via the plurality of transparent windows. Therefore, the liquid level of the cooling liquid can be checked. Accordingly, when the liquid level of the cooling liquid is abnormal, it can be checked and addressed promptly.

It will be apparent to those skilled in the art that various modifications and variations can be made to the present invention. It is intended that the specification and examples be considered as exemplary embodiments only, with the scope of the invention being indicated by the following claims and their equivalents.

What is claimed is:

1. A manifold assembly, comprising:
   a liquid inlet pipe, having a first accommodating space, a first liquid inlet, a plurality of first liquid outlets and a plurality of openings, wherein the first accommodating space is configured to accommodate a cooling liquid, the first accommodating space is in fluid communication with the first liquid inlet, the plurality of first liquid outlets and the plurality of openings, and the plurality of first liquid outlets are configured to be in fluid communication with at least one server;
   a plurality of transparent windows, covering the plurality of openings, wherein the cooling liquid is visible from outside via the plurality of transparent windows; and
   a liquid return pipe, having a second accommodating space, a plurality of second liquid inlets and a second liquid outlet, wherein the second accommodating space is configured to accommodate a cooling liquid, the second accommodating space is in fluid communication with the plurality of second liquid inlets and the second liquid outlet, and the plurality of second liquid inlets are configured to be in fluid communication with the at least one server.

2. The manifold assembly according to claim 1, further comprising a plurality of first pipe connectors, wherein the plurality of first pipe connectors are located at the first liquid inlet and the plurality of first liquid outlets of the liquid inlet pipe, respectively.

3. The manifold assembly according to claim 2, wherein the plurality of first pipe connectors are leak-proof pipe connectors.

4. The manifold assembly according to claim 1, further comprising a plurality of second pipe connectors, wherein the plurality of second pipe connectors are located at the plurality of second liquid inlets and the second liquid outlet of the liquid return pipe, respectively.

5. The manifold assembly according to claim 4, wherein the plurality of second pipe connectors are leak-proof pipe connectors.

6. The manifold assembly according to claim 1, wherein a cross-sectional area of the liquid return pipe is 1.5 times to 2 times larger than a cross-sectional area of the liquid inlet pipe.

7. The manifold assembly according to claim 1, further comprising a first exhaustion valve and a second exhaustion valve, wherein the first exhaustion valve is arranged adjacent to the first liquid inlet, the plurality of first liquid outlets and the plurality of openings of the liquid inlet pipe, and the second exhaustion valve is arranged adjacent to the plurality of second liquid inlets and the second liquid outlet of the liquid return pipe.

8. A manifold, comprising:
a pipe, having an accommodating space, a liquid inlet, a plurality of liquid outlets and a plurality of openings, wherein the accommodating space is configured to accommodate a cooling liquid, the accommodating space is in fluid communication with the liquid inlet, the plurality of liquid outlets and the plurality of openings, and the plurality of liquid outlets are configured to be in fluid communication with at least one server; and
a plurality of transparent windows, covering the plurality of openings, wherein the cooling liquid is visible from outside via the plurality of transparent windows.

9. The manifold according to claim 8, further comprising a plurality of pipe connectors, wherein the plurality of pipe connectors are located at the liquid inlet and the plurality of liquid outlets of the pipe, respectively.

10. The manifold according to claim 8, further comprising an exhaustion valve, wherein the exhaustion valve is arranged adjacent to the liquid inlet, the plurality of liquid outlets and the plurality of openings of the pipe.

* * * * *